(12) United States Patent
Kadkhodayan et al.

(10) Patent No.: US 8,402,918 B2
(45) Date of Patent: Mar. 26, 2013

(54) SHOWERHEAD ELECTRODE WITH CENTERING FEATURE

(75) Inventors: Babak Kadkhodayan, Pleasanton, CA (US); Anthony de la Llera, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 903 days.

(21) Appl. No.: 12/419,878

(22) Filed: Apr. 7, 2009

(65) Prior Publication Data
US 2010/0252197 A1 Oct. 7, 2010

(51) Int. Cl.
| C23C 16/455 | (2006.01) |
| C23C 16/50 | (2006.01) |
| C23C 16/505 | (2006.01) |
| C23C 16/509 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl. ......... 118/723 E; 118/723 ER; 156/345.43; 156/345.44; 156/345.45; 156/345.46; 156/345.47

(58) Field of Classification Search ............... 118/723 E, 118/723 ER; 156/345.43, 345.44, 345.45, 156/345.46, 345.47
See application file for complete search history.

(56) References Cited

U.S. PATENT DOCUMENTS

| 4,585,920 A | 4/1986 | Hoog et al. |
| 4,612,077 A | 9/1986 | Tracy et al. |
| 4,793,975 A * | 12/1988 | Drage .................. 422/186.05 |
| 4,908,095 A | 3/1990 | Kagatsume et al. |
| 5,074,456 A | 12/1991 | Degner et al. |
| 5,200,016 A | 4/1993 | Namose |
| 5,356,515 A | 10/1994 | Tahara et al. |
| 5,423,936 A | 6/1995 | Tomita et al. |
| D363,464 S | 10/1995 | Fukasawa |
| 5,500,256 A | 3/1996 | Watabe et al. |
| 5,534,751 A | 7/1996 | Lenz et al. |
| 5,558,717 A * | 9/1996 | Zhao et al. .................. 118/715 |
| 5,569,356 A | 10/1996 | Lenz et al. |
| 5,589,002 A | 12/1996 | Su |
| 5,590,975 A | 1/1997 | Horntvedt |
| 5,593,540 A | 1/1997 | Tomita et al. |
| 5,624,498 A | 4/1997 | Lee et al. |
| 5,740,009 A | 4/1998 | Pu et al. |
| 5,746,875 A | 5/1998 | Maydan et al. |
| 5,766,364 A | 6/1998 | Ishida et al. |

(Continued)

FOREIGN PATENT DOCUMENTS
| JP | 56-087667 A1 | 7/1981 |
| JP | 07-066180 A | 3/1995 |

(Continued)

OTHER PUBLICATIONS

Commonly Owned U.S. Appl. No. 12/875,869, filed Sep. 3, 2010.

(Continued)

*Primary Examiner* — Rudy Zervigon

(74) *Attorney, Agent, or Firm* — Buchanan Ingersoll & Rooney PC

(57) ABSTRACT

A showerhead electrode includes inner and outer steps at an outer periphery thereof, the outer step cooperating with a clamp ring which mechanically attaches the electrode to a backing plate.

14 Claims, 3 Drawing Sheets

U.S. PATENT DOCUMENTS

| | | | |
|---|---|---|---|
| 5,792,269 | A | 8/1998 | Deacon et al. |
| D411,516 | S | 6/1999 | Imafuku et al. |
| D412,513 | S | 8/1999 | Ooyabu |
| 5,959,409 | A | 9/1999 | Dornfest et al. |
| 5,993,597 | A | 11/1999 | Saito et al. |
| 5,997,649 | A | 12/1999 | Hillman |
| D420,022 | S | 2/2000 | Burkhart et al. |
| 6,024,799 | A | 2/2000 | Chen et al. |
| 6,036,782 | A | 3/2000 | Tanaka et al. |
| 6,039,836 | A | 3/2000 | Dhindsa et al. |
| 6,050,216 | A * | 4/2000 | Szapucki et al. ........... 118/723 E |
| 6,050,506 | A | 4/2000 | Guo et al. |
| D425,919 | S | 5/2000 | Burkhart et al. |
| 6,079,356 | A | 6/2000 | Umotoy et al. |
| 6,086,710 | A | 7/2000 | Miyashita et al. |
| 6,110,287 | A | 8/2000 | Arai et al. |
| 6,110,556 | A * | 8/2000 | Bang et al. ................... 428/64.1 |
| 6,132,512 | A | 10/2000 | Horie et al. |
| 6,170,432 | B1 | 1/2001 | Szapucki et al. |
| 6,173,673 | B1 * | 1/2001 | Golovato et al. ......... 118/723 E |
| 6,200,415 | B1 | 3/2001 | Maraschin |
| 6,206,972 | B1 | 3/2001 | Dunham |
| D441,348 | S | 5/2001 | Todd et al. |
| 6,228,208 | B1 | 5/2001 | Lill et al. |
| 6,237,528 | B1 * | 5/2001 | Szapucki et al. ........... 118/723 E |
| 6,302,964 | B1 | 10/2001 | Umotoy et al. |
| 6,368,450 | B2 | 4/2002 | Hayashi |
| 6,389,677 | B1 | 5/2002 | Lenz |
| 6,391,787 | B1 | 5/2002 | Dhindsa et al. |
| 6,432,261 | B2 | 8/2002 | Watanabe et al. |
| 6,444,037 | B1 | 9/2002 | Frankel et al. |
| 6,461,435 | B1 | 10/2002 | Littau et al. |
| 6,477,980 | B1 | 11/2002 | White et al. |
| 6,495,233 | B1 | 12/2002 | Shmurun et al. |
| 6,506,686 | B2 | 1/2003 | Masuda et al. |
| 6,550,126 | B1 | 4/2003 | Szettella et al. |
| 6,553,932 | B2 | 4/2003 | Liu et al. |
| 6,558,506 | B1 | 5/2003 | Freeman et al. |
| 6,586,886 | B1 | 7/2003 | Katz et al. |
| 6,653,734 | B2 | 11/2003 | Flanner et al. |
| 6,723,202 | B2 | 4/2004 | Nagaiwa et al. |
| D490,450 | S | 5/2004 | Hayashi et al. |
| 6,753,498 | B2 | 6/2004 | Sirkis et al. |
| D493,873 | S | 8/2004 | Hayashi |
| 6,786,175 | B2 | 9/2004 | Dhindsa et al. |
| 6,818,096 | B2 * | 11/2004 | Barnes et al. ............ 156/345.43 |
| 6,827,815 | B2 | 12/2004 | Hytros et al. |
| 6,830,624 | B2 * | 12/2004 | Janakiraman et al. ........ 118/715 |
| 6,872,258 | B2 | 3/2005 | Park et al. |
| 6,899,786 | B2 | 5/2005 | Senzaki et al. |
| 6,936,135 | B2 | 8/2005 | Antolik |
| 6,942,753 | B2 | 9/2005 | Choi et al. |
| 6,998,014 | B2 * | 2/2006 | Chen et al. ................ 156/345.34 |
| 7,083,702 | B2 | 8/2006 | Blonigan et al. |
| 7,159,537 | B2 | 1/2007 | Wickramanayaka et al. |
| 7,166,200 | B2 | 1/2007 | Saigusa et al. |
| 7,196,283 | B2 | 3/2007 | Buchberger, Jr. et al. |
| 7,270,713 | B2 | 9/2007 | Blonigan et al. |
| 7,296,534 | B2 | 11/2007 | Fink |
| 7,543,547 | B1 * | 6/2009 | Kennedy et al. ........... 118/723 E |
| 7,682,946 | B2 * | 3/2010 | Ma et al. ...................... 438/481 |
| 7,827,657 | B2 * | 11/2010 | Kennedy et al. .................. 29/20 |
| 7,850,779 | B2 * | 12/2010 | Ma et al. ........................ 118/715 |
| 8,147,648 | B2 * | 4/2012 | Dhindsa .................. 156/345.43 |
| 8,161,906 | B2 * | 4/2012 | Kadkhodayan et al. .. 118/723 E |
| 2001/0000104 | A1 | 4/2001 | Li et al. |
| 2002/0048963 | A1 | 4/2002 | Campbell et al. |
| 2002/0139479 | A1 | 10/2002 | Antolik |
| 2002/0179245 | A1 | 12/2002 | Masuda et al. |
| 2003/0127806 | A1 | 7/2003 | Belchuk |
| 2003/0143841 | A1 * | 7/2003 | Yang et al. ................... 438/656 |
| 2003/0185729 | A1 | 10/2003 | Ko et al. |
| 2004/0074609 | A1 | 4/2004 | Fischer et al. |
| 2004/0108301 | A1 | 6/2004 | Hao et al. |
| 2004/0173313 | A1 | 9/2004 | Beach |
| 2005/0116427 | A1 | 6/2005 | Seidel et al. |
| 2005/0133160 | A1 | 6/2005 | Kennedy et al. |
| 2005/0150456 | A1 | 7/2005 | Senzaki et al. |
| 2005/0241765 | A1 | 11/2005 | Dhindsa et al. |
| 2005/0276928 | A1 | 12/2005 | Okumura et al. |
| 2006/0000803 | A1 | 1/2006 | Koshiishi et al. |
| 2006/0016559 | A1 | 1/2006 | Kobayashi et al. |
| 2006/0037701 | A1 | 2/2006 | Koshiishi et al. |
| 2006/0042754 | A1 | 3/2006 | Yoshida et al. |
| 2006/0043067 | A1 | 3/2006 | Kadkhodayan et al. |
| 2006/0066247 | A1 | 3/2006 | Koshiishi et al. |
| 2006/0075969 | A1 | 4/2006 | Fischer |
| 2006/0090704 | A1 | 5/2006 | Ide et al. |
| 2006/0108069 | A1 | 5/2006 | Gernert |
| 2006/0207502 | A1 | 9/2006 | Dhindsa et al. |
| 2006/0236934 | A1 | 10/2006 | Choi et al. |
| 2006/0283551 | A1 | 12/2006 | Son |
| 2006/0283552 | A1 | 12/2006 | Rogers |
| 2006/0288934 | A1 * | 12/2006 | Takahashi et al. ............ 118/715 |
| 2007/0032081 | A1 | 2/2007 | Chang et al. |
| 2007/0044716 | A1 | 3/2007 | Tetsuka et al. |
| 2007/0068629 | A1 | 3/2007 | Shih et al. |
| 2007/0128863 | A1 * | 6/2007 | Ma et al. ....................... 438/680 |
| 2007/0131350 | A1 | 6/2007 | Ricci et al. |
| 2007/0137573 | A1 * | 6/2007 | Kholodenko et al. .... 118/723 E |
| 2007/0181868 | A1 | 8/2007 | Fujiwara et al. |
| 2007/0187038 | A1 | 8/2007 | Ren et al. |
| 2007/0215580 | A1 | 9/2007 | Koshiishi et al. |
| 2007/0235660 | A1 | 10/2007 | Hudson |
| 2007/0284045 | A1 | 12/2007 | Fischer et al. |
| 2007/0284246 | A1 | 12/2007 | Keii et al. |
| 2008/0087641 | A1 | 4/2008 | La Llera et al. |
| 2008/0090417 | A1 | 4/2008 | La Llera et al. |
| 2008/0099120 | A1 | 5/2008 | Larson et al. |
| 2008/0141941 | A1 | 6/2008 | Augustino et al. |
| 2008/0227301 | A1 | 9/2008 | Fang et al. |
| 2008/0308228 | A1 | 12/2008 | Stevenson et al. |
| 2008/0308229 | A1 | 12/2008 | Patrick et al. |
| 2009/0081878 | A1 | 3/2009 | Dhindsa |
| 2009/0095220 | A1 | 4/2009 | Meinhold et al. |
| 2009/0095424 | A1 * | 4/2009 | Bettencourt et al. ...... 156/345.34 |
| 2009/0163034 | A1 | 6/2009 | Larson et al. |
| 2009/0223932 | A1 | 9/2009 | Hida et al. |
| 2009/0236040 | A1 | 9/2009 | Patrick et al. |
| 2010/0000683 | A1 | 1/2010 | Kadkhodayan et al. |
| 2010/0003824 | A1 * | 1/2010 | Kadkhodayan et al. ...... 438/710 |
| 2010/0003829 | A1 * | 1/2010 | Patrick et al. ................. 438/758 |
| 2010/0038033 | A1 | 2/2010 | Hardin et al. |
| 2010/0252197 | A1 * | 10/2010 | Kadkhodayan et al. . 156/345.34 |
| 2010/0261354 | A1 | 10/2010 | Bettencourt et al. |
| 2012/0073501 | A1 * | 3/2012 | Lubomirsky et al. ..... 118/723 E |

FOREIGN PATENT DOCUMENTS

| | | |
|---|---|---|
| JP | 09-013172 A | 1/1997 |
| JP | 09-245994 | 9/1997 |
| JP | 2001085398 A | 3/2001 |
| WO | WO2009/114175 A2 | 9/2009 |

OTHER PUBLICATIONS

Commonly Owned U.S. Appl. No. 12/884,269, filed Sep. 17, 2010.
Commonly Owned U.S. Appl. No. 12/903,412, filed Oct. 13, 2010.
Commonly Owned U.S. Appl. No. 12/872,980, filed Aug. 31, 2010.
Commonly Owned U.S. Appl. No. 12/872,982, filed Aug. 31, 2010.
Commonly Owned U.S. Appl. No. 12/872,984, filed Aug. 31, 2010.
Official Action dated Jan. 22, 2010 for Chinese Patent Appln. No. 201020114128.8.
International Search Report and Written Opinion mailed Feb. 24, 2010 for PCT/US2009/003953.
Commonly owned U.S. Appl. No. 61/036,862, filed Mar. 14, 2008.
Commonly owned U.S. Appl. No. 11/896,375, filed Aug. 31, 2007.
Commonly owned U.S. Appl. No. 12/216,526, filed Jul. 7, 2008.

* cited by examiner

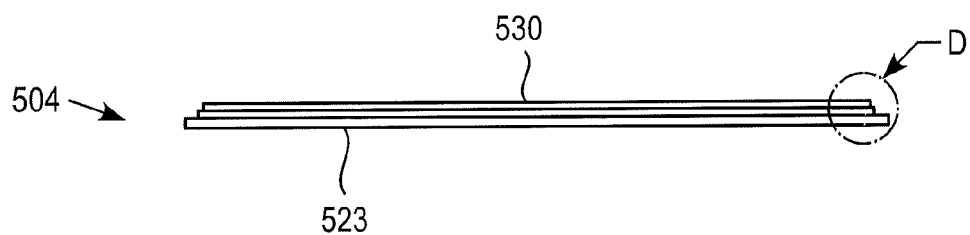
FIG. 1C
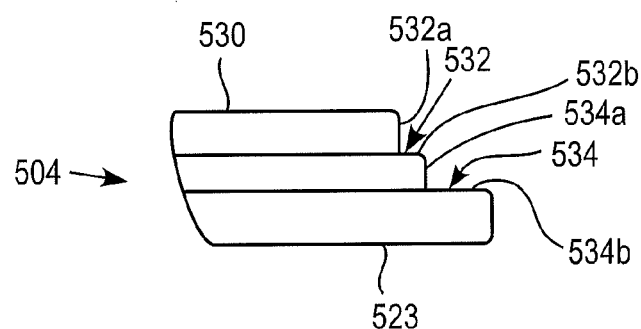
FIG. 1D
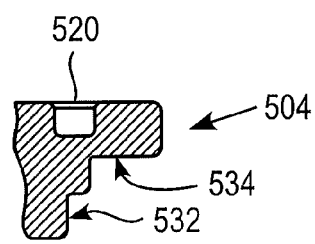
FIG. 1E
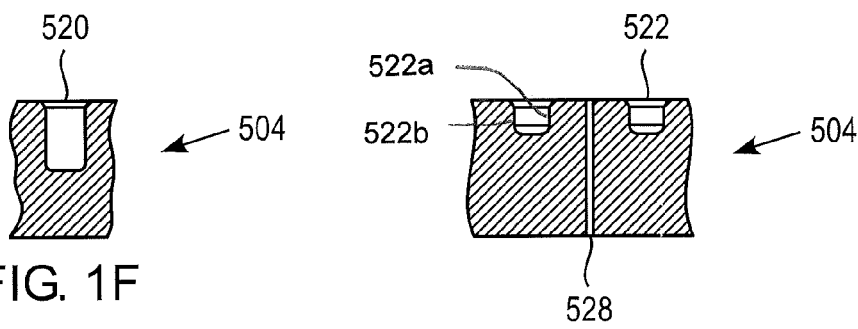
FIG. 1F
FIG. 1G

SHOWERHEAD ELECTRODE WITH CENTERING FEATURE

FIELD OF THE INVENTION

The invention relates to a showerhead electrode used as an upper electrode in a plasma processing chamber in which semiconductor components can be manufactured. The showerhead electrode can be clamped to a backing plate with a clamp ring as described in U.S. application Ser. No. 12/216,526 entitled Clamped Showerhead Electrode Assembly, filed Jul. 7, 2008, the entire content of which is hereby incorporated by reference.

SUMMARY

A showerhead electrode used as an upper electrode of a capacitively coupled plasma processing chamber comprises a circular plate having a plasma exposed surface on a lower face thereof and a mounting surface on an upper face thereof. The lower face includes inner and outer steps at an outer periphery of the plate. The inner step has a smaller diameter than the outer step and the outer step is located between the inner step and the mounting surface. The outer step is configured to mate with an inwardly extending flange of a clamp ring and the inner step is configured to mate with an inner step of an outer electrode which surrounds the showerhead electrode such that an inner tapered surface of the outer electrode extends from the outer edge of the plasma exposed surface. The mounting surface includes an annular channel configured to receive a centering ring and a plurality of alignment pin recesses configured to receive alignment pins arranged in a pattern matching alignment pin holes in a backing plate against which the plate is held by the clamp ring and the plate includes process gas outlets arranged in a pattern matching gas supply holes in the backing plate.

BRIEF DESCRIPTION OF THE DRAWINGS

FIG. 1C shows a side view with the inner step closest to the plasma exposed surface and the outer step closest to the upper face of the electrode.

FIG. 1D shows an enlarged view of detail D of FIG. 1C.

FIG. 1E is a cross section near the outer periphery of the electrode showing an alignment pin recess 520.

FIG. 1F is a cross section at an inner portion of the electrode showing an alignment pin recess 520.

FIG. 1G is a cross section at the center of the electrode showing the annular channel 522 located between the center gas hole and the first row of gas holes (not shown).

DETAILED DESCRIPTION

Figure 1A:
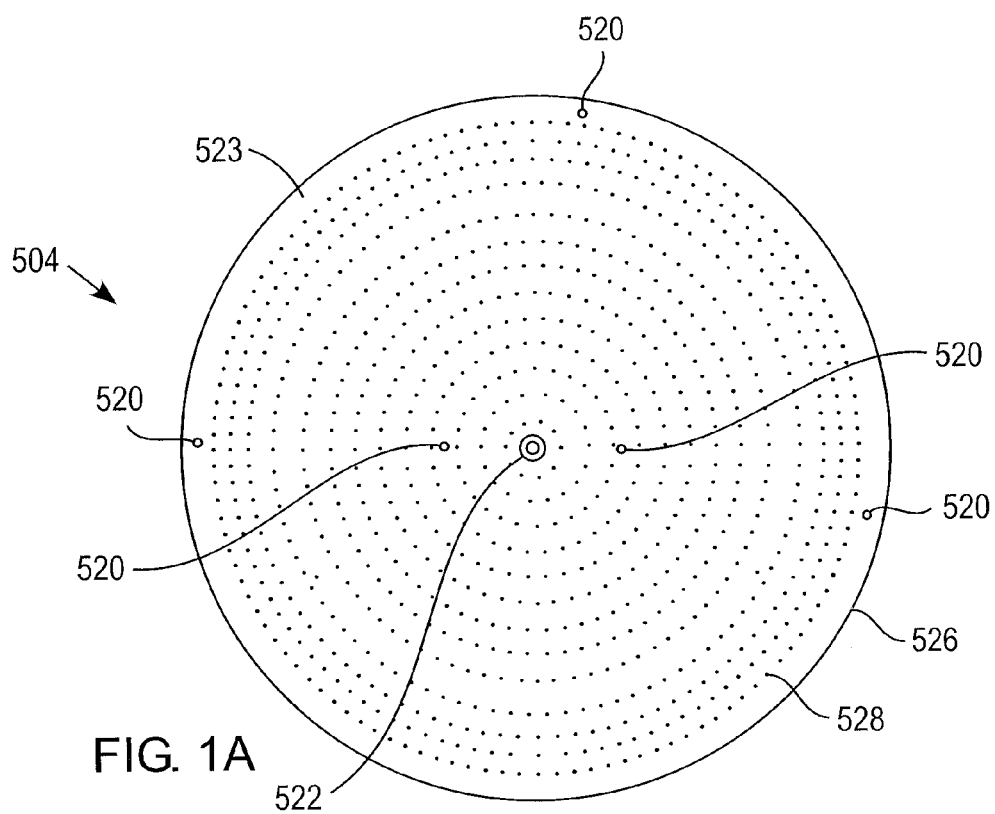
FIG. 1A shows a front planar view of the upper face 522 with the 13 rows of gas holes, annular channel 522 and 5 pin holes 520.

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, $HBr$, $Cl_2$ and $SF_6$ or mixtures thereof with $O_2$, $N_2$, He or Ar is introduced into the etching chamber and maintained at a pressure which is typically in the millitorr range. The upper electrode is provided with gas hole(s), which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched sidewalls. The etching reactor electrodes may often be fabricated by bonding two or more dissimilar members with mechanically compliant and/or thermally conductive adhesives, allowing for a multiplicity of function.

FIGS. 1A-D show details of showerhead electrode 504. The electrode 504 is preferably a plate of high purity (less than 10 ppm impurities) low resistivity (0.005 to 0.02 ohm-cm) single crystal silicon with alignment pin holes 520 in an upper face (mounting surface) 523 which receive alignment pins (not shown) and steps in an outer edge 526 which mate with a clamp ring (not shown) and an inner lip of an outer electrode (not shown). Gas holes 528 of suitable diameter and/or configuration (e.g., 0.017 inch diameter holes) extend from the upper face to the lower face (plasma exposed surface) 530 and can be arranged in any suitable pattern. In the embodiment shown, a single gas hole is located at the center of the electrode and the remaining gas holes are evenly spaced circumferentially apart in 13 concentric rows with 10 gas holes in the first row located about 0.5 inch from the center of the electrode, 18 gas holes in the second row located about 1 inch from the center, 28 gas holes in the third row located about 1.4 inches from the center, 38 gas holes in the fourth row located about 1.8 inches from the center, 46 gas holes in the fifth row located about 2.3 inches from the center, 56 gas holes in the sixth row located about 2.7 inches from the center, 66 gas holes in the seventh row located about 3.2 inches from the center, 74 gas holes in the eighth row located about 3.6 inches from the center, 84 gas holes in the ninth row located about 4.1 inches from the center, 94 gas holes in the tenth row located about 4.6 inches from the center, 104 gas holes in the eleventh row located about 5.1 inches from the center, 110 gas holes in the twelfth row located about 5.4 inches from the center and 120 holes in the thirteenth row located about 5.7 inches from the center.

A preferred gas hole arrangement has 40 to 80%, preferably about 60% of the gas holes in an inner zone and 20 to 60%, preferably about 40% of the gas holes in an outer zone separated from the inner zone by a gas seal such as an O-ring. Thus, inner and outer zones above a wafer undergoing plasma etching can be fed the same or different etch gas at the same or different flow rates to optimize etch uniformity.

The upper face of the electrode includes 5 alignment pin holes 520 with 2 pin holes near the center and 3 pin holes near the outer edge of the electrode. The pin holes can have diameters of about 0.116 inch. The 2 central pin holes are radially aligned and are about 0.200 inch deep located about 1.6 inches from the center at locations between the third and fourth row of gas holes. The outer pin holes are about 0.100 inch deep and include one pin hole radially aligned with the central pin holes about 6 inches from the center and two other pin holes offset 97.5° and 170° therefrom with the second and the third outer pin holes the same distance from the center but offset 92.5° from each other.

For receipt of a centering ring, an annular channel 522 is located between the center gas hole and the first row of gas holes. The channel preferably has an inner diameter of about 0.24 inch, an outer diameter of about 0.44 inch and depth of about 0.100 inch with an outward taper at the inlet of the channel and an inward taper at the bottom of the channel.

The outer steps include an inner step 532 and an outer step 534 machined into the silicon plate so as to extend completely around the silicon plate. In a preferred embodiment, the silicon plate has a thickness of about 0.400 inch and an outer diameter of about 12.560 inch, the inner step 532 has an inner diameter of about 12.004 inches, an outer diameter of about 12.135 inch and extends about 0.13 inch into the plasma exposed surface 530 and the outer step 534 has an inner diameter of about 12.135 inches and an outer diameter of about 12.560 inches and extends about 0.24 inch into the plasma exposed surface 530. The inner step 532 has a vertical surface 532a about 0.13 inch long and a horizontal surface 532b about 0.065 inch long and the outer step 534 has a vertical surface 534a about 0.11 inch long and a horizontal surface 534b about 0.218 inch long.

Figure 1B:
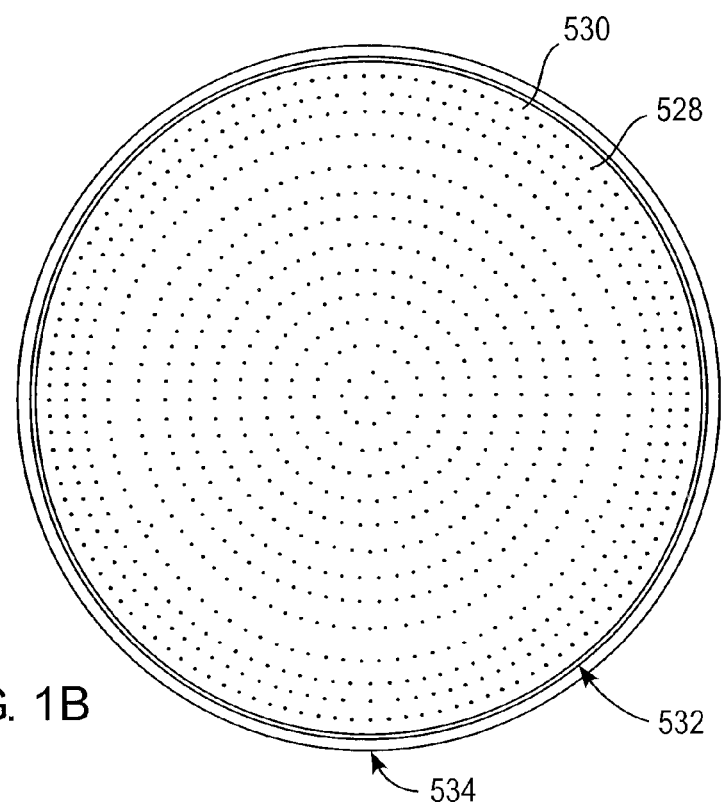
FIG. 1B shows a front planar view showing the plasma exposed surface of the electrode 504 with a center gas hole and 13 rows of gas holes.

FIG. 1B shows a front planar view showing the plasma exposed surface 530 of the electrode 504 with the 13 rows of gas holes. FIG. 1A shows a front planar view of the upper face 523 with the 13 rows of gas holes and 6 pin holes 520. FIG. 1C shows a side view with the inner step closest to the plasma exposed surface and the outer step closest to the upper face of the electrode. FIG. 1D shows an enlarged view of detail D of FIG. 1C showing the inner and outer steps with 6 rounded corners provided at the outer edge of the upper face 523, the outer edge of the lower face 530 and transitions between the horizontal and vertical surfaces 532a, 532b, 534a, 534b with corners of each other and the upper and lower faces 522, 530 (e.g., rounded with a 0.025 inch radius).

FIGS. 1E, F and G show cross sections of the showerhead electrode 504 at the outer periphery (FIG. 1E), inner zone (FIG. 1F) and center (FIG. 1G) of the showerhead electrode. As shown in FIG. 1E, alignment pin recess 522 is aligned with inner step 532. The alignment pin recess 522 in FIG. 1F is deeper than the pin recess in FIG. 1E and is located between the third and fourth rows of gas outlets. As shown in FIG. 1G, the annular channel 522 has the same depth as the outer pin recess 520 and the channel 522 is concentric around the center gas outlet 528.

Figure 2:
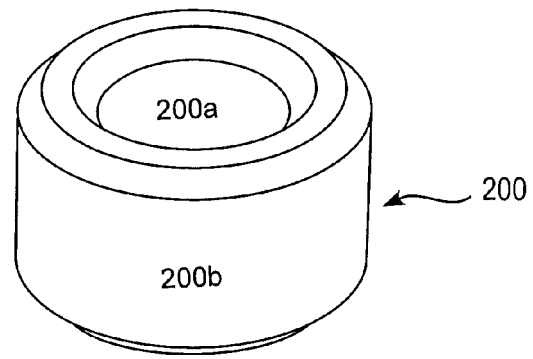
FIG. 2 shows a perspective view of a centering ring 200 (from detail H in FIG. 3) which can be used to align a backing plate 300 and showerhead electrode 504.
Figure 3:
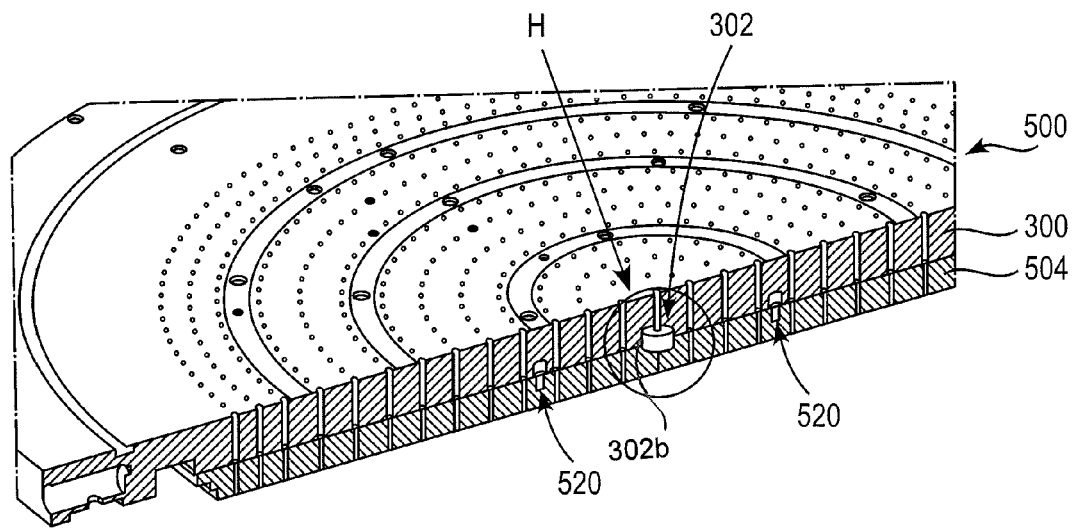
FIG. 3 shows a cross sectional perspective view of a showerhead electrode assembly 500 with the centering ring located in opposed channels of the backing plate and the showerhead electrode.

FIG. 2 is an enlarged view of a centering ring 200 (from detail H of FIG. 3) which can be used to align the showerhead electrode 504 with a backing plate 300. The ring 200 is preferably configured such that an inner wall 200a of the ring 200 provides a friction fit with the inner wall 522a of channel 522 and the outer wall 200b of the ring 200 provides a friction fit with the outer wall 302b of channel 302 in backing plate 300. The ring may also provide a gas seal between the electrode 504 and backing plate 300.

The ring 200 is preferably of a dielectric material such as "TORLON 5030" which is compatible with the elevated temperatures and high purity requirements in semiconductor processing environments. The ring 200 is preferably configured to (a) center against the outer wall 302b of the annular channel 302 in the aluminum backing plate 300 and (b) center against the inner wall 522a of the annular channel 522 in the silicon electrode. During wafer processing such as plasma etching, the electrode 504 and backing plate 300 heat up and differential thermal expansion places high loads on the ring 200. To accommodate the thermal stresses, the ring 200 is tapered at its top and bottom and channels 522, 302 include similar tapers which mate with the tapers on the ring. At ambient temperature the ring 200 bears against the inner wall 522a of channel 522 and outer wall 302b of channel 302 and the outer wall 522b of channel 522 need not frictionally engage the outer wall 200b of the ring 200 and the inner wall (not shown) of the channel 302 need not frictionally engage the inner wall 200a of ring 200. However, as the silicon electrode 504 and aluminum backing plate heat up, the ring 200 disengages the inner wall 522a of channel 522 and instead bears against the inner wall (not shown) of channel 302 in the backing plate. Thus, alignment of the gas holes in the showerhead electrode with the gas outlets in the backing plate can be maintained.

While the invention has been described in detail with reference to specific embodiments thereof, it will be apparent to those skilled in the art that various changes and modifications can be made, and equivalents employed, without departing from the scope of the appended claims.

What is claimed is:

1. A showerhead electrode for use as an upper electrode of a capacitively coupled plasma processing chamber, comprising:

a circular plate having a plasma exposed surface on a lower face thereof, a mounting surface on an upper face thereof;

the mounting surface including an annular channel configured to receive a centering ring and a plurality of alignment pin recesses configured to receive alignment pins arranged in a pattern matching alignment pin holes in a backing plate;

the circular plate including process gas outlets arranged in a pattern matching gas supply holes in the backing plate, the gas outlets communicating with gas passages extending between the upper and lower faces.

2. The electrode of claim 1, wherein the annular channel is located between a center gas outlet at the center of the circular plate and a row of circumferentially spaced apart gas outlets and the alignment pin recesses include at least one intermediate pin recess on opposite sides of the annular channel, and a plurality of pin recesses circumferentially spaced apart in an outer zone of the upper face.

3. The electrode of claim 1, wherein the circular plate is of single crystal silicon.

4. The electrode of claim 1, wherein the gas outlets include a pattern of 13 circumferential rows.

5. The electrode of claim 4, wherein the 13 circumferential rows include 10 inner rows equally spaced apart by a distance greater than the distance separating the 3 outer rows.

6. The electrode of claim 1, wherein the lower face includes inner and outer steps at an outer periphery of the circular plate and the inner step having a smaller diameter than the outer step and the outer step being located between the inner step and the mounting surface, the outer step includes a horizontal surface which extends inwardly from the outer periphery by a first distance, the inner step includes a horizontal surface which extends inward from the outer step by a second distance, the first distance being at least two times larger than the second distance.

7. The electrode of claim 6, wherein the circular plate has parallel upper and lower faces with a thickness between the upper and lower faces of no greater than 0.5 inch, the horizontal surface of the outer step is spaced from the upper face by a first vertical distance, the horizontal surface of the inner step is spaced from the lower face by a second vertical distance, and the horizontal surface of the outer step is separated from the horizontal surface of the inner step by a third distance, the first vertical distance being greater than the second vertical distance and the second vertical distance being greater than the third vertical distance.

8. The electrode of claim 1, wherein the annular channel has an inner diameter of about 0.24 inch, an outer diameter of about 0.44 inch and a depth of about 0.1 inch.

9. A showerhead electrode assembly comprising the electrode of claim 1, a backing plate and a centering ring, the backing plate including an annular channel configured to receive the centering ring and an inner wall of the centering ring being frictionally engaged with an inner wall of the annular channel in the showerhead electrode and an outer wall of the centering ring being frictionally engaged with an outer wall of the annular channel in the backing plate at ambient temperature.

10. The electrode assembly of claim 9, wherein the showerhead electrode is silicon and the backing plate is aluminum, the showerhead electrode assembly being operable at temperatures of 20 to 200° C. and the centering ring being of a material which expands more than the silicon such that a lower portion of the inner wall of the centering ring disengages from the inner wall of the channel in the showerhead electrode while an upper portion of the inner wall of the centering ring frictionally engages the inner wall of the channel in the backing plate to thereby maintain alignment of gas holes in the showerhead electrode and the backing plate.

11. A centering ring operable to frictionally hold a backing plate to a showerhead electrode, the centering ring being of a polymer material with a height of about 0.3 inch, inner diameter of about 0.24 inch and outer diameter of about 0.44 inch.

12. The centering ring of claim 11, wherein an inner wall of the centering ring is operable to frictionally engage an inner wall of an annular channel in the showerhead electrode and an outer wall of the centering ring is operable to frictionally engage an outer wall of an annular channel in the backing plate at ambient temperature.

13. The centering ring of claim 12, wherein the centering ring is of a material which expands more than the showerhead electrode so that a lower portion of the inner wall of the centering ring disengages from the inner wall of the channel in the showerhead electrode while an upper portion of the inner wall of the centering ring frictionally engages the inner wall of the channel in the backing plate.

14. A showerhead electrode of claim 1, wherein the lower face includes inner and outer steps at an outer periphery of the plate and the inner step having a smaller diameter than the outer step and the outer step being located between the inner step and the mounting surface.

* * * * *